(12) United States Patent
Liu et al.

(10) Patent No.: US 9,646,959 B2
(45) Date of Patent: May 9, 2017

(54) SLIM BEZEL AND DISPLAY HAVING THE SAME

(71) Applicant: Xiaomi Inc., Beijing (CN)

(72) Inventors: Anyu Liu, Beijing (CN); Guosheng Li, Beijing (CN); Zhengdong Xiao, Beijing (CN)

(73) Assignee: Xiaomi Inc., Beijing (CN)

( * ) Notice: Subject to any disclaimer, the term of this patent is extended or adjusted under 35 U.S.C. 154(b) by 0 days.

(21) Appl. No.: 14/757,455

(22) Filed: Dec. 23, 2015

(65) Prior Publication Data

US 2016/0190117 A1 Jun. 30, 2016

(30) Foreign Application Priority Data

Dec. 26, 2014 (CN) .......................... 2014 1 0834739
Jan. 26, 2015 (CN) .......................... 2015 1 0038519

(51) Int. Cl.
| | |
|---|---|
| H01L 27/02 | (2006.01) |
| G02F 1/1345 | (2006.01) |
| G02F 1/1362 | (2006.01) |
| H01L 27/12 | (2006.01) |
| H05K 1/02 | (2006.01) |

(52) U.S. Cl.
CPC ...... H01L 27/0207 (2013.01); G02F 1/13452 (2013.01); G02F 1/136286 (2013.01); H01L 27/124 (2013.01); H05K 1/025 (2013.01)

(58) Field of Classification Search
CPC ..... H01L 29/06; H01L 29/0696; H01L 29/42; H01L 29/4238; H01L 29/66; H01L 29/66795; H01L 29/78; H01L 29/785; H01L 27/02; H01L 27/0207; H01L 27/124
USPC ......................................................... 257/401
See application file for complete search history.

(56) References Cited

U.S. PATENT DOCUMENTS 8,344,616 B2 * 1/2013 Sim ...................... G09G 3/3225
                                                        313/505
9,276,017 B2 * 3/2016 Lee ........................ H01L 51/524
(Continued)

FOREIGN PATENT DOCUMENTS

| CN | 1967824 A | 5/2007 |
| CN | 102314011 A | 1/2012 |
| CN | 102540525 A | 7/2012 |

(Continued)

OTHER PUBLICATIONS

International Search Report of PCT Application No. PCT/CN2015/093290, mailed Feb. 3, 2016, issued by the State Intellectual Property Office of P.R. China as ISA (4 pages).

(Continued)

*Primary Examiner* — Monica D Harrison
(74) *Attorney, Agent, or Firm* — Finnegan, Henderson, Farabow, Garrett & Dunner LLP

(57) ABSTRACT

A bezel of a display includes source lines with a same length, gate in panel (GIP) lines, and at least two customized integrated circuit (IC) chips arranged along a straight line in a lateral direction. Each of the customized IC chips is coupled to at least one of the source lines or the GIP lines. Circuit layouts on the customized IC chips are, together, equivalent to a circuit layout on a standard IC chip. A sum of widths of the customized IC chips in the lateral direction is greater than a width of the standard IC chip.

13 Claims, 6 Drawing Sheets

(56) References Cited

U.S. PATENT DOCUMENTS

2011/0096258 A1    4/2011   Shim et al.
2014/0146520 A1    5/2014   Tosh et al.

FOREIGN PATENT DOCUMENTS

| | | |
|---|---|---|
| CN | 103389819 A | 11/2013 |
| CN | 103677424 A | 3/2014 |
| CN | 103928009 A | 7/2014 |
| CN | 104267853 A | 1/2015 |
| CN | 104345937 A | 2/2015 |
| CN | 104640390 A | 5/2015 |
| JP | 2000187451 A | 7/2000 |
| JP | 2004053702 A | 2/2004 |
| JP | 2005331835 A | 12/2005 |
| JP | 2007192968 A | 8/2007 |
| JP | 2008003134 A | 1/2008 |
| KR | 101300683 B1 | 8/2013 |

OTHER PUBLICATIONS

English version of International Search Report of International Patent Application No. PCT/CN2015/093290, from the State Intellectual Property Office of China, mailed Feb. 3, 2016 (2 pages).
Extended Search Report for European Application No. EP 15202763.7 from the European Patent Office, dated May 12, 2016.

* cited by examiner

SLIM BEZEL AND DISPLAY HAVING THE SAME

CROSS-REFERENCE TO RELATED APPLICATIONS

This application claims priority to Chinese Patent Application No. 201510038519.3, filed Jan. 26, 2015, and Chinese Patent Application No. 201410834739.2, filed Dec. 26, 2014, the entire contents of both of which are incorporated herein by reference.

TECHNICAL FIELD

The present disclosure relates to displays and, more particularly, to a slim bezel and a display having the same.

BACKGROUND

Efforts have been made to narrow bezels of displays, to minimize the area of the displays occupied by the bezels. A bezel of a display, i.e., the outside frame or rim around the display, can include an upper part, a left part, a right part, and a lower part, which are also referred to as an upper bezel, a left bezel, a right bezel, and a lower bezel. In conventional technologies, the upper bezel, the left bezel, and the right bezel on a display can be narrowed. Generally, however, the lower bezel of a conventional display is relatively wide, because integrated circuit (IC) chips, flexible printed circuit (FPC) bonding, pixel data lines (also referred to as "source lines"), and row control logic (also referred to as "Gate In Panel (GIP)") lines, which are used for controlling displaying of the display, are provided in the lower bezel, and the layouts of these components are limited by the manufacturing process.

SUMMARY

In accordance with the present disclosure, there is provided a bezel of a display. The bezel includes source lines with a same length, gate in panel (GIP) lines, and at least two customized integrated circuit (IC) chips arranged along a straight line in a lateral direction. Each of the customized IC chips is coupled to at least one of the source lines or the GIP lines. Circuit layouts on the customized IC chips are, together, equivalent to a circuit layout on a standard IC chip. A sum of widths of the customized IC chips in the lateral direction is greater than a width of the standard IC chip.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims. The "slim bezel" mentioned herein generally refers to a narrowed lower bezel of a display. The display includes at least a display screen and the lower bezel.

Figure 1:
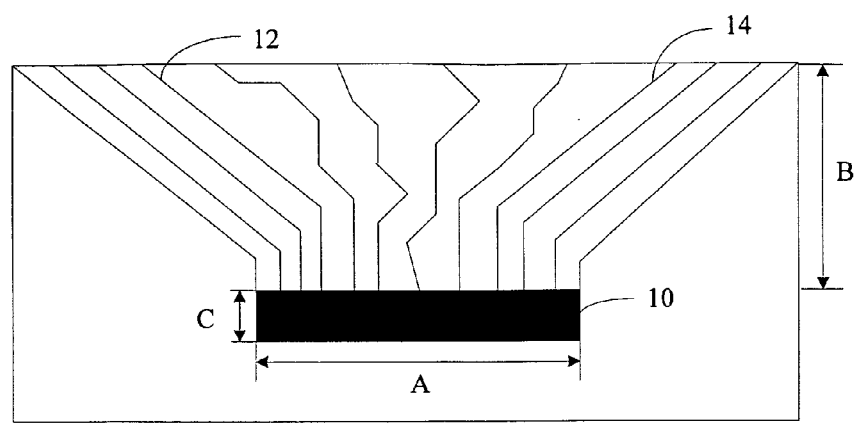
FIG. 1 is a schematic diagram illustrating a conventional bezel of a display.

FIG. 1 is a schematic diagram illustrating a conventional bezel of a display. In the bezel shown in FIG. 1, a standard IC chip 10 has a height C and a width A. The bezel is also provided with source lines 12 and gate in panel (GIP) lines 14. In general, the number of the GIP lines 14 is far less than the number of the source lines 12, and the source lines 12 require a relatively high level of synchronicity during signal transmission. Thus, more attention needs to be paid to the layout of the source lines 12. For a high definition display screen made from a-Si and indium gallium zinc oxide (IGZO), each source line 12 or each GIP line 14 is coupled to a pin of the standard IC chip 10. For a display screen with a resolution of 1280*1024, since each pixel includes three transistors (corresponding to red, green, and blue, respectively) and one source line is required for each column, a total of 1280*3=3840 source lines need to be arranged in the limited width of the bezel. Even for a low temperature polysilicon (LTPs) display with a multiplexer circuit, about 1280 source lines are still needed.

Therefore, a certain height needs to be occupied by the source lines 12 extending from the limited width A into the display panel. Such a height is also referred to as a "layout height." Moreover, when the display screen is displaying, good synchronization needs to be maintained among pixels coupled with the source lines 12. In other words, the source lines 12 are required to have a same length. Accordingly, a larger layout height B is needed, and therefore the lower bezel of the display is relatively wide.

With conventional manufacturing processes, it is difficult to make IC chips narrower and at the same time longer.

In accordance with the present disclosure, IC chips that are narrower and shorter than the conventional IC chip 10 are used. Accordingly, the standard IC chip is replaced by at least two customized IC chips with a smaller length and a smaller width, so that the width of the lower bezel of a display can be reduced.

Figure 2A:
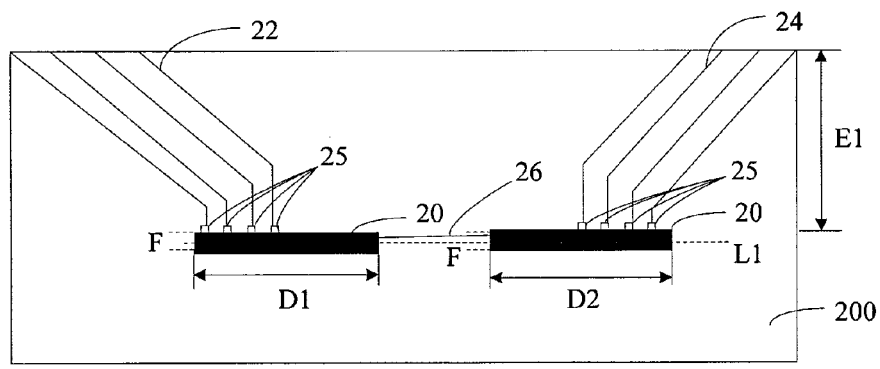
FIG. 2A is a front view of a slim bezel of a display according to an exemplary embodiment.

FIG. 2A is a front view of a slim bezel 200 of a display according to an exemplary embodiment. In FIG. 2A, the slim bezel 200 includes at least two customized IC chips 20, source lines 22 with a same length, and GIP lines 24. Circuit layouts on the customized IC chips 20, when combined together, are equivalent to a circuit layout on a standard IC chip.

The customized IC chips 20 are arranged and aligned laterally along a straight line L1, and the sum of the widths of the customized IC chips 20 in lateral direction is greater than the width of the standard IC chip. For example, the sum of the widths, D1+D2, of the two customized IC chips 20 in FIG. 2A is greater than the width, A, of the standard IC chip 10 in FIG. 1.

In the example shown in FIG. 2A, the customized IC chips 20 are arranged in a same manner. That is, chip planes, each of which is defined by the width and the height of one of the customized IC chips 20, lie in a same plane. The layout direction of the customized IC chips 20 shown in FIG. 2A is defined as a first layout manner, i.e., a layout manner in which the plane defined by the width and the height of each of the customized IC chips 20 is parallel to a plane in which the slim bezel 200 lies. Hereinafter, a plane in which a slim bezel lies is also referred to as a "bezel plane." This layout manner is more clearly illustrated in FIGS. 2B and 2C.

Figure 2B:
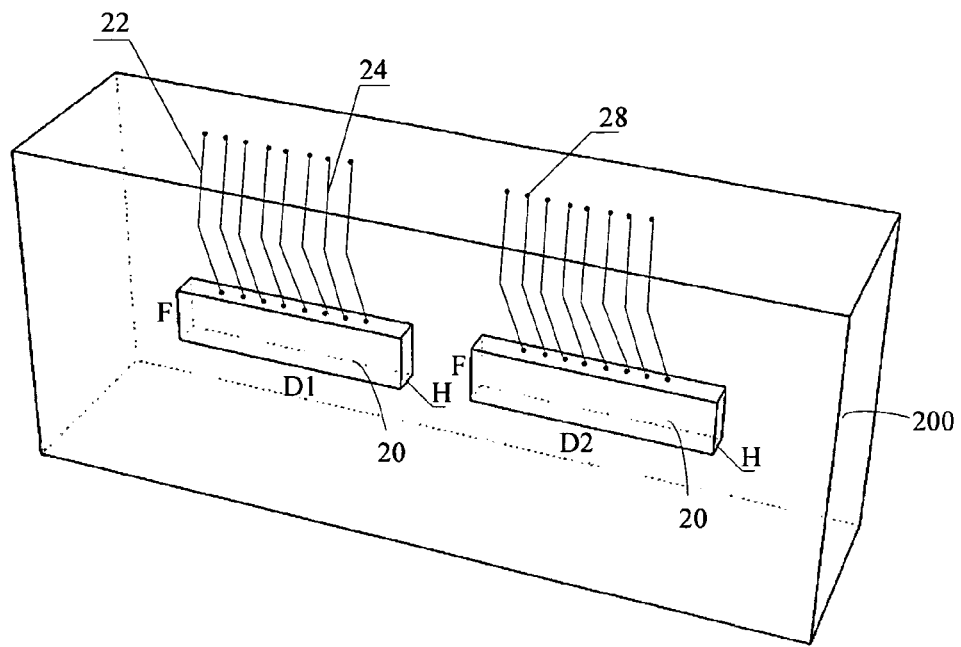
FIG. 2B is a perspective view of the slim bezel shown in FIG. 2A.

FIG. 2B is a perspective view of the slim bezel 200, with source lines 22 and GIP lines 24 arranged in one layer, with the customized IC chip 20 on the left and the customized IC chip 20 on the right arranged in the same manner. That is, the plane defined by the width D1 and the height F of the customized IC chip 20 on the left and the plane defined by the width D2 and the height F of the customized IC chip 20 on the right lie in the same plane, and are parallel to the plane in which the slim bezel 200 lies. A line in which the thickness H of each of the customized IC chips 20 lies is perpendicular to the bezel plane.

Figure 2C:
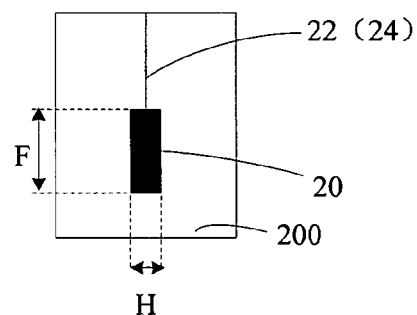
FIG. 2C is a sectional view of an enlarged portion of the slim bezel shown in FIG. 2A.

FIG. 2C is a sectional view of an enlarged portion of the slim bezel 200. As shown in FIG. 2C, the plane defined by the width and the height F of each of the customized IC chips 20 is parallel to the bezel plane, and the thickness H of each of the customized IC chips 20 is perpendicular to the bezel plane. According to the present disclosure, the bezel plane is the same as or parallel to a plane in which the display screen of the display lies, which is also referred to as a "screen plane."

According to the present disclosure, adjacent customized IC chips 20 can be arranged in a contacting or in a non-contacting manner. That is, a distance between adjacent customized IC chips 20 is greater than 0 (non-contacting manner) or equals 0 (contacting manner). When neighboring customized IC chips 20 are arranged in contact with each other, the sum of the widths of the customized IC chips 20 is greater than the width of the standard IC chip. On the hand, when neighboring customized IC chips 20 do not contact each other, that is, when there is a certain distance between neighboring customized IC chips 20, a distance from the left side of the leftmost one of the customized IC chips 20 to the right side of the rightmost one of the customized IC chips 20 is typically greater than the width A of the standard IC chip 10 shown in FIG. 1.

In order to reduce the layout height occupied by the customized IC chips 20 in the vertical direction so as to narrow the lower bezel of the display as much as possible, the customized IC chips 20 can be arranged and aligned laterally along a straight line. That is, central lines of the customized IC chips 20 lie along the straight line L1, as shown in FIG. 2A, or approximately along the straight line L1. In the embodiments described here in connection with FIGS. 2A-2F and 4, a central line of a customized IC chip 20 refers to a line passing through a center of the height, e.g., height F, of the customized IC chip 20.

According to the present disclosure, the circuit layouts on the customized IC chips 20 are equivalent to the circuit layout on the standard IC chip, i.e., the circuitry on the standard IC chip is distributed onto the customized IC chips 20. Therefore, a sum of the widths of the customized IC chips 20 in the lateral direction can be set to be greater than the width of the standard IC chip. Thus, since the layout of the source lines 22 and the GIP lines 24 occupies a fixed area, the layout height of the layout of the source lines 22 and the GIP lines 24 can be reduced. As shown in FIG. 2A, a layout height E1 is smaller than the layout height B in FIG. 1. Therefore, the lower bezel of the display according to the present disclosure has a reduced width.

In some embodiments, a customized IC chip 20 can be coupled with only one or more of the source lines 22, only one or more of the GIP lines 24, or one or more of the source lines and one or more of the GIP lines 24, depending on the internal circuit layout of the customized IC chip 20.

In some embodiments, the customized IC chip 20 is provided with pins 25 distributed evenly at the upper side. The pins 25 include pins that are coupled to the source lines 22 and/or the GIP lines 24 in a one-to-one correspondence, and can include additional pins for other purposes.

Since each of the customized IC chips 20 is provided with pins 25 distributed evenly at the upper side thereof, which include pins that are coupled to the source lines 22 and/or the GIP lines 24 in a one-to-one correspondence, a waste of area at the upper sides of the customized IC chips 20 for the layout of the source lines 22 and the GIP lines 24 can be reduced. Thus, the source lines 22 and the GIP lines 24 can be evenly distributed so as to maximize the reduction of the layout height E1 in FIG. 2A.

In some embodiments, pixels in the display screen need to be turned on or off simultaneously, and thus there is a high requirement on timeliness for the pixels. Accordingly, lengths of the source lines 22 can be set to be the same as each other. In this scenario, in order to enable the pixels to be controlled at the same time, every adjacent two of the customized IC chips 20 are coupled via a wire 26 (omitted in other drawings), such that the customized IC chips 20 can transmit signals to the source lines 22 coupled thereto simultaneously, so as to control the source lines 22 at the same time.

Moreover, since the circuitry on the standard IC chip is divided into circuitries on the customized IC chips 20, and various components in the circuitries occupy a fixed layout area, a sum of the areas of the customized IC chips 20 approximately equals an area of the standard IC chip. In some embodiments, considering the area loss at edges of the customized IC chips 20, the sum of the areas of the customized IC chips 20 can be slightly larger than the area of the standard IC chip.

In some embodiments, heights F of the customized IC chips 20 can be equal to each other. Since the sum of the areas of the customized IC chips approximately equals the area of the standard IC chip, the height F of each of the customized IC chips 20 can be less than the height C of the standard IC chip in FIG. 1. According to the present disclosure, the widths of the customized IC chips can be the same as or different from each other. For example, D1 may or may not be equal to D2.

In FIGS. 2A, 2B, and 2C, the source lines 22 and the GIP lines 24 coupled to the customized IC chips are coupled to corresponding ports 28 of the display screen and arranged in one layer, that is, all of the source lines 22 and the GIP lines 24 lie in a same layer. In some embodiments, to further reduce the layout height so as to further narrow the lower bezel of the display, the source lines 22 and the GIP lines 24 can be arranged in at least two layers, as described below.

Figure 2D:
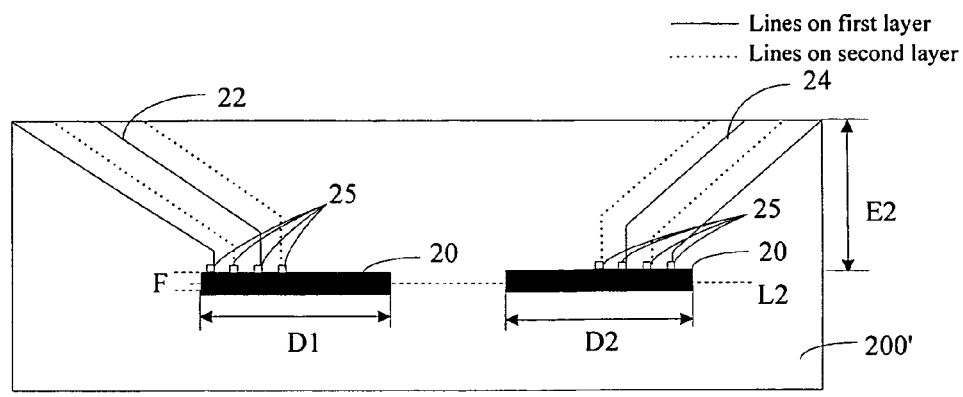
FIG. 2D is a front view of a slim bezel according to another exemplary embodiment.
Figure 2E:
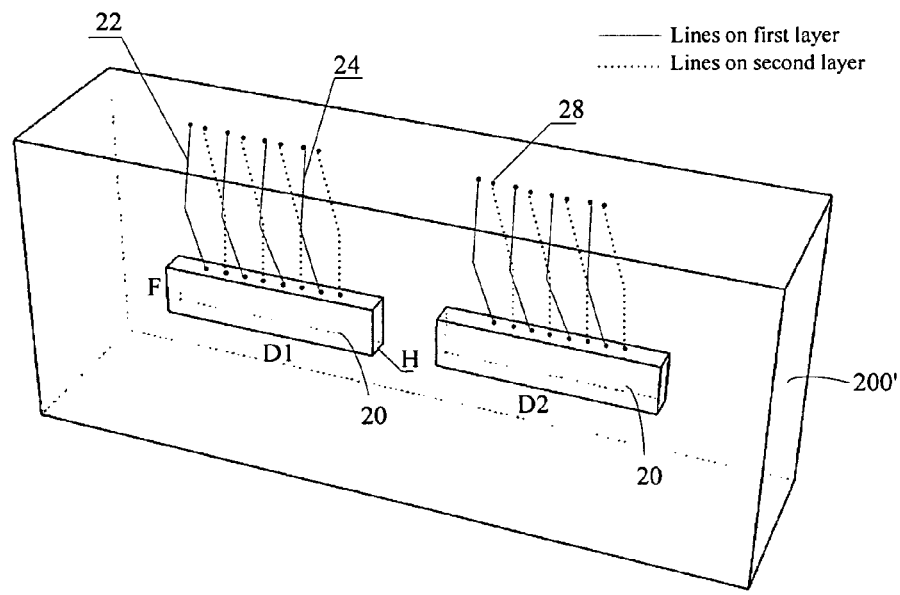
FIG. 2E is a perspective view of the slim bezel shown in FIG. 2D.

FIG. 2D is a front view of a slim bezel 200' according to another exemplary embodiment. In the slim bezel 200', the source lines 22 and GIP lines 24 are arranged in a layout of two layers. In FIG. 2D, those of the source lines 22 and the GIP lines 24 indicated by solid lines lie in a first layer, while those indicated by dotted lines lie in a second layer. The arrangement of the source lines 22 and the GIP lines 24 in two layers is further shown in FIG. 2E, which is a perspective view of the slim bezel 200'. In the slim bezel 200', the customized IC chips 20 and the pins 25 provided thereon are the same as those in slim bezel 200.

Figure 2F:
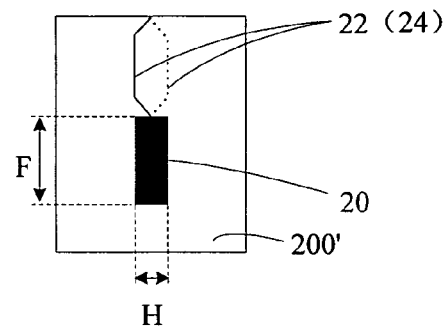
FIG. 2F is a sectional view of an enlarged portion of the slim bezel shown in FIG. 2D.

FIG. 2F is a sectional view of an enlarged portion of the slim bezel 200'. The source lines 22 and the GIP lines 24 lying in two layers respectively are coupled to the customized IC chips 20 and corresponding ports 28 of the display screen. As shown in FIG. 2F, the plane defined by the width D1 or D2 and the height F of a customized IC chip 20 is parallel to the bezel plane, while the thickness H of the customized IC chip 20 is perpendicular to the bezel plane.

In the slim bezel 200', since the source lines 22 and the GIP lines 24 lie in two layers, the thickness of the lower bezel can be utilized to arrange the source lines 22 and the GIP lines 24. Therefore, the amount of circuitry lines arranged in one layer is reduced and each layer requires less layout area. Thus, with a fixed width for each layer, the height occupied by the circuitry lines for the layer can be reduced. That is, the layout height in the lower bezel can be reduced and the lower bezel can be further narrowed. For example, a layout height E2 in FIG. 2D is less than the layout height E1 in FIG. 2A. Thus, a straight line L2, along which central lines of the customized IC chips 20 in FIG. 2D lie, differs from the straight line L1 in FIG. 2A. In particular, the straight line L2 is located closer to an upper edge of the slim bezel 200' than the straight line L1 to an upper edge of the slim bezel 200, and thus is closer to the display screen of the display than L1.

In some embodiments, as described below, the customized IC chips 20 can be arranged in a second layout manner, i.e., a layout manner in which the plane defined by the width and the height of each of the customized IC chips 20 is perpendicular to the bezel plane, to further narrow the lower bezel of the display.

Figure 3A:
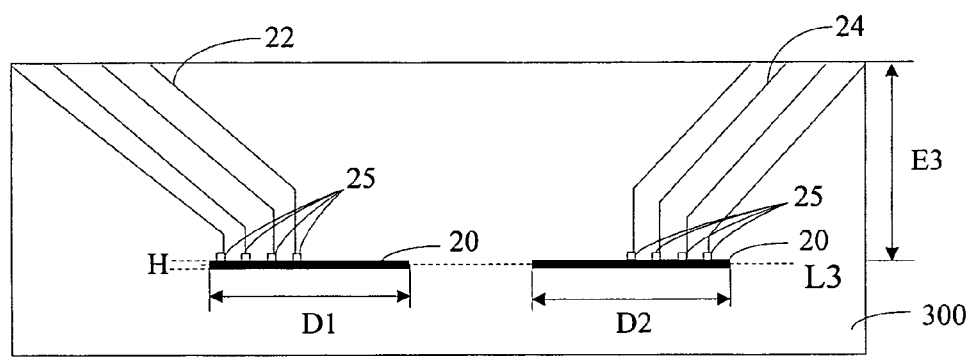
FIG. 3A is a front view of a slim bezel of a display according to another exemplary embodiment.

FIG. 3A is a front view of a slim bezel 300 of a display according to another exemplary embodiment. As shown in FIG. 3A, the customized IC chips 20 provided within the slim bezel 300 are laterally arranged and aligned along a straight line L3, and the customized IC chips 20 are provided to be perpendicular to the screen plane. That is, the customized IC chips 20 in the slim bezel 300 are rotated 90° as compared to the customized IC chips 20 in the slim bezel 200. The straight line L3 passes through a center of the thickness H of the respective customized IC chips 20. Since a thickness H of the customized IC chip 20 is less than a width thereof, i.e. the width F shown in FIG. 2A, the lower bezel of the display shown in FIG. 3A can be further narrowed as compared to that shown in FIG. 2A.

Figure 3B:
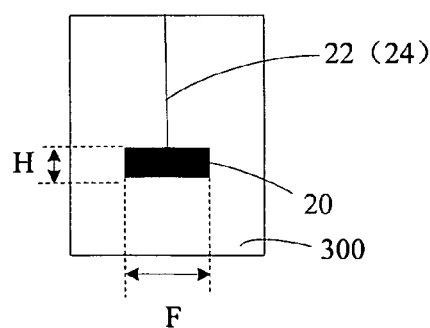
FIG. 3B is a sectional view of an enlarged portion of the slim bezel shown in FIG. 3A.

FIG. 3B is a sectional view of an enlarged portion of the slim bezel 300. As shown in FIG. 3B, the thickness H of the customized IC chip 20 is aligned with a height direction, i.e., the vertical direction, of the slim bezel 300, while the height F of the customized IC chip 20 is aligned with a thickness direction of the slim bezel 300. Since the thickness H of the customized IC chip 20 is less than the height F of the customized IC chip 20, the height occupied by the customized IC chips 20 in the slim bezel 300 can be further reduced as compared to the slim bezel 200, so that the lower bezel of the display is further narrowed.

Figure 3C:
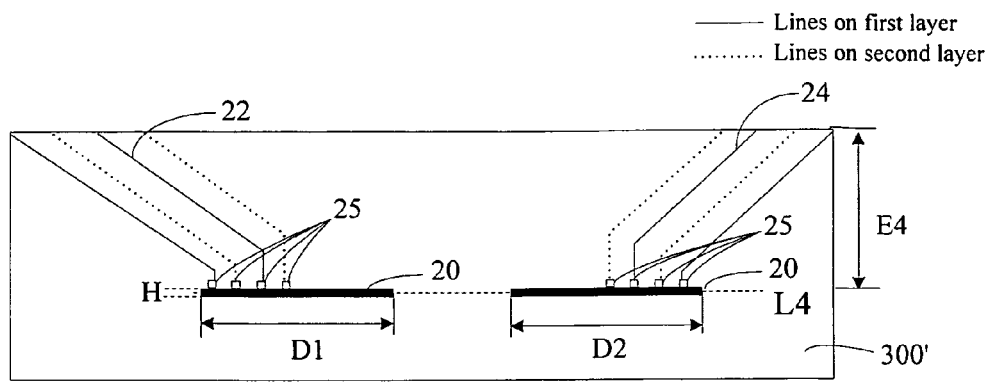
FIG. 3C is a front view of a slim bezel according to an exemplary embodiment.

In the slim bezel 300, the source lines 22 and the GIP lines 24 are arranged in a same layer. Similar to the slim bezel 200', the source lines 22 and the GIP 24 in the scenario of the slim bezel 300 can also be arranged in two or more layers, as shown in FIG. 3C, which is a front view of a slim bezel 300' according to another exemplary embodiment. In the slim bezel 300', those of the source lines 22 and the GIP lines 24 indicated by solid lines lie in a first layer, while those indicated by dotted lines lie in a second layer. Layout of remaining parts of the slim bezel 300' and configuration thereof are similar to those of the slim bezel 300, a detailed description of which is omitted here.

Figure 3D:
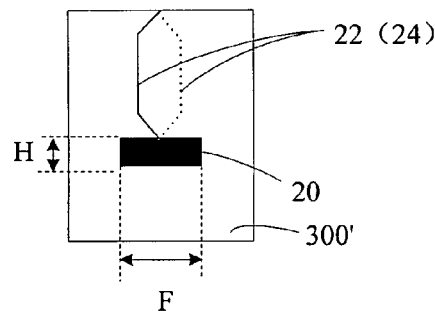
FIG. 3D is a sectional view of an enlarged portion of the slim bezel shown in FIG. 3C.

FIG. 3D is a sectional view of an enlarged portion of the slim bezel 300'. The source lines 22 and the GIP lines 24 lying in two layers, respectively, within the slim bezel 300' are coupled to the customized IC chips 20 and corresponding ports 28 of the display screen. As shown in FIG. 3D, the thickness H of the customized IC chip 20 is aligned with the height direction of the slim bezel 300', while the height F of the customized IC chip 20 is aligned with the thickness direction of the slim bezel 300'.

As a result of the above-described arrangement of the circuitry lines in two or more layers, a height E4 in FIG. 3C is less than a height E3 in FIG. 3A. Thus, a straight line L4, along which central lines of the customized IC chips 20 in FIG. 3C lie, differs from the straight line L3 in FIG. 3A. In the embodiments described here in connection with FIGS. 3A-3D, a central line of a customized IC chip 20 refers to a line passing through a center of the thickness, e.g., thickness H, of the customized IC chip 20. In particular, L4 is located closer to the upper edge of the slim bezel 300' than L3 to the upper edge of the slim bezel 300, and thus is closer to the display screen of the display than L3.

As shown in FIG. 3A, the slim bezel 300 is similar to the slim bezel 200 shown in FIG. 2A, except for the arrangement direction of the customized IC chips. Therefore, detailed description of the structure of the slim bezel 300 is omitted herein.

Figure 4:
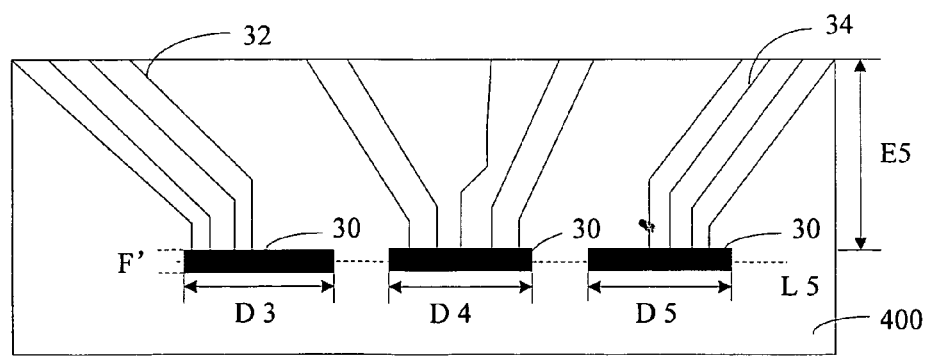
FIG. 4 is a front view of a slim bezel of a display according to another exemplary embodiment.

Moreover, in the examples shown in FIGS. 2A-3D, two customized IC chips 20 with smaller length and smaller width are illustrated. In other embodiments, according to actual needs, the standard IC chip can be divided into three or more customized IC chips with smaller length and smaller width. FIG. 4 is a front view of a slim bezel 400 of a display according to another exemplary embodiment. As shown in FIG. 4, the standard IC chip is divided into three customized IC chips 30 with smaller length and smaller width. The customized IC chips 30 are arranged and aligned laterally along a straight line L5, having respective widths D3, D4, and D5. The central lines of the customized chips 30 lie along the straight line L5. A total area of the customized IC chips 30 equals an area of the standard IC chip 10. A total width of the customized IC chips 30, i.e., D3+D4+D5, is greater than the width A of the standard IC chip 10. A height F' of each of the customized IC chips 30 is less than the height C of the standard IC chip 10. The customized IC chips 30 are also provided with pins 25 distributed evenly at the upper side thereof, including pins coupled to source lines 32 and GIP lines 34 one by one. Similarly, a layout height E5 as shown in FIG. 4 is smaller than the layout height B as shown in FIG. 1. In other words, the lower bezel of the display is narrowed.

Figure 5:
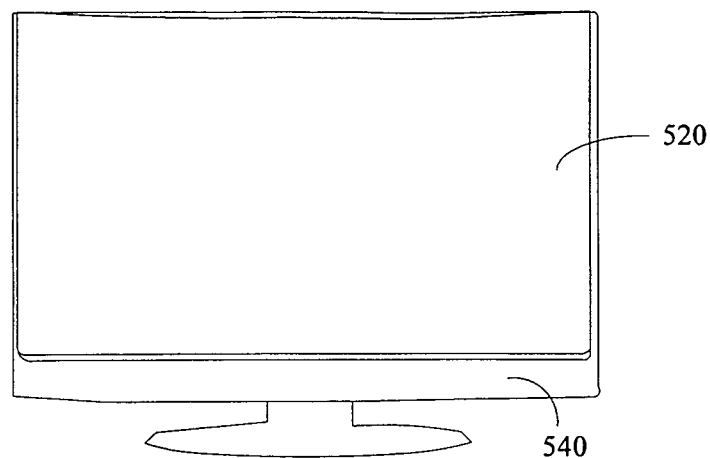
FIG. 5 schematically shows a display having a slim bezel according to an exemplary embodiment.

FIG. 5 schematically shows a display provided with a slim bezel, according to an exemplary embodiment. As shown in FIG. 5, the display includes a display screen 520 and a slim bezel 540. The slim bezel 540 includes a slim bezel consistent with embodiments of the present disclosure, such as one of the exemplary slim bezels shown in FIGS. 2A-2F, FIG. 3A-3D, and FIG. 4, details of which are omitted here.

According to the present disclosure, layout height required by circuitry lines, such as source lines and GIP lines, in a display can be reduced, and thus the lower bezel of the display can be narrowed.

Furthermore, it should be noted that, terms "height", "width", and "thickness" in the description of the customized IC chips according to embodiments of the present disclosure are used based on illustration of those drawings described above. For the same customized IC chip, a value of the width thereof is greater than a value of the height thereof which is greater than a value of the thickness thereof. Accordingly, terms "height", "width" and "thickness" in the description of the customized IC chips according to embodiments of the present disclosure are used only for purpose of easy description, rather than limiting protection scope of the present disclosure. According to actual application, "height" of the customized IC chip may also be referred to as "width", while "width" thereof may also be referred to as "length".

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A bezel of a display, comprising:
   source lines with a same length;
   gate in panel (GIP) lines; and
   at least two customized integrated circuit (IC) chips arranged along a straight line in a lateral direction, each of the customized IC chips being coupled to at least one of the source lines or the GIP lines,
   wherein:
   circuit layouts on the customized IC chips are, together, equivalent to a circuit layout on a standard IC chip, and
   a sum of widths of the customized IC chips in the lateral direction is greater than a width of the standard IC chip.

2. The bezel of claim 1, wherein adjacent two of the customized IC chips are coupled to each other via a wire, and the customized IC chips are configured to transmit signals simultaneously to all of the GIP lines coupled to the customized IC chips.

3. The bezel of claim 1, wherein a sum of areas of the customized IC chips approximately equals an area of the standard IC chip.

4. The bezel of claim 3, wherein respective heights of the customized IC chips equal each other and are less than a height of the standard IC chip.

5. The bezel of claim 4, wherein respective widths of the customized IC chip equal each other.

6. The bezel of claim 4, wherein respective widths of the customized IC chip do not equal each other.

7. The bezel of claim 1, wherein adjacent two of the customized IC chips do not contact each other.

8. The bezel of claim 1, wherein each of the customized IC chips includes pins distributed evenly at an upper side of the customized IC chip, and the pins are coupled to the source lines and the GIP lines in a one-to-one correspondence.

9. The bezel of claim 1, wherein each of the customized IC chips includes a chip plane defined by a width and a height of the customized IC chip, and the respective chip planes of the at least two customized IC chips lie in a same plane.

10. The bezel of claim 9, wherein the chip planes are parallel to a bezel plane in which the bezel lies.

11. The bezel of claim 9, wherein the chip planes are perpendicular to a bezel plane in which the bezel lies.

12. The bezel of claim 1, wherein the source lines and the GIP lines are coupled to corresponding ports of a display screen and are arranged in at least one layer.

13. A display, comprising:
   a display screen; and
   the bezel according to claim 1.

* * * * *